United States Patent
Chakraborty et al.

(10) Patent No.: US 7,723,216 B2
(45) Date of Patent: May 25, 2010

(54) IN-SITU DEFECT REDUCTION TECHNIQUES FOR NONPOLAR AND SEMIPOLAR (AL, GA, IN)N

(75) Inventors: Arpan Chakraborty, Isla Vista, CA (US); Kwang-Choong Kim, Seoul (KR); James S. Speck, Goleta, CA (US); Steven P. DenBaars, Goleta, CA (US); Umesh K. Mishra, Montecito, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 11/801,283

(22) Filed: May 9, 2007

(65) Prior Publication Data

US 2007/0267654 A1 Nov. 22, 2007

Related U.S. Application Data

(60) Provisional application No. 60/798,933, filed on May 9, 2006.

(51) Int. Cl.
*H01L 21/20* (2006.01)
(52) U.S. Cl. .................. 438/483; 438/479; 438/689; 438/481; 438/604; 257/189
(58) Field of Classification Search ................ 438/689, 438/483; 257/79, 190
See application file for complete search history.

(56) References Cited

U.S. PATENT DOCUMENTS

| | | | |
|---|---|---|---|
| 6,252,261 B1 * | 6/2001 | Usui et al. | ........... 257/190 |
| 6,316,785 B1 | 11/2001 | Nunoue et al. | |
| 6,325,850 B1 | 12/2001 | Beaumont et al. | |
| 6,475,882 B1 * | 11/2002 | Sakai et al. | ........... 438/483 |
| 6,530,991 B2 | 3/2003 | Tanaka et al. | |
| 6,802,902 B2 | 10/2004 | Beaumont et al. | |
| 6,869,702 B2 * | 3/2005 | Shibata et al. | ........... 428/698 |
| 7,091,514 B2 | 8/2006 | Craven et al. | |
| 7,118,929 B2 | 10/2006 | Frayssinet et al. | |
| 7,220,658 B2 | 5/2007 | Haskell et al. | |
| 2002/0137342 A1 * | 9/2002 | Ishida et al. | ........... 438/689 |
| 2002/0144645 A1 | 10/2002 | Kim et al. | |
| 2003/0024475 A1 | 2/2003 | Anderson | |
| 2003/0198837 A1 | 10/2003 | Craven et al. | |
| 2004/0137732 A1 * | 7/2004 | Frayssinet et al. | ........... 438/689 |

(Continued)

FOREIGN PATENT DOCUMENTS

WO 03089694 10/2003

(Continued)

OTHER PUBLICATIONS

International Search Report.

(Continued)

*Primary Examiner*—Fernando L Toledo
*Assistant Examiner*—Mamadou Diallo
(74) *Attorney, Agent, or Firm*—Gates & Cooper LLP

(57) ABSTRACT

A method for growing reduced defect density planar gallium nitride (GaN) films is disclosed. The method includes the steps of (a) growing at least one silicon nitride ($SiN_x$) nanomask layer over a GaN template, and (b) growing a thickness of a GaN film on top of the $SiN_x$ nanomask layer.

27 Claims, 8 Drawing Sheets

U.S. PATENT DOCUMENTS

| | | | |
|---|---|---|---|
| 2005/0142391 | A1 | 6/2005 | Dmitriev et al. |
| 2005/0161697 | A1 | 7/2005 | Nakahata et al. |
| 2005/0205884 | A1 | 9/2005 | Kim et al. |
| 2005/0258451 | A1 | 11/2005 | Saxler et al. |
| 2006/0008941 | A1 | 1/2006 | Haskell et al. |
| 2006/0128124 | A1 | 6/2006 | Haskell et al. |
| 2006/0266281 | A1* | 11/2006 | Beaumont et al. ............ 117/84 |
| 2006/0278865 | A1 | 12/2006 | Craven et al. |
| 2007/0015345 | A1 | 1/2007 | Baker et al. |
| 2007/0126023 | A1 | 6/2007 | Haskell et al. |

FOREIGN PATENT DOCUMENTS

| | | |
|---|---|---|
| WO | 03089695 | 10/2003 |
| WO | 2004061909 | 7/2004 |
| WO | 2004061969 | 7/2004 |
| WO | 2007009035 | 1/2007 |

OTHER PUBLICATIONS

Sakai, S. et al., "A new method of reducing dislocation density in GaN layer grown on sapphire substrate by MOVPE," J. Cryst. Growth 221:334-337, 2000.

Tanaka, S. et al., "Anti-Surfactant in III-Nitride Epitaxy -Quantum Dot Formation and Dislocation Termination-," Jpn. J. Appl. Phys. 39:L831-L834, 2000.

Yun, F. et al., "Efficacy of single and double SiNx interlayers on defect reduction in GaN overlayers grown by organometallic vapor-phase epitaxy," J. Appl. Phys. 98:123502-123502-8, 2005.

Srikant, V. et al., "Mosaic structure in epitaxial thin films having large lattice mismatch," J. Appl. Phys. 82 (9):4286-4295, 1997.

Heying, B. et al., "Role of threading dislocation structure on the x-ray diffraction peak widths in epitaxial GaN films," Appl. Phys. Lett. 68(5):643-645, 1996.

Chakraborty, A. et al., "Defect reduction in nonpolar a-plane GaN films using in situ SiNx nanomask," Appl. Phys. Lett. 89:041903-041903-3, 2006.

Sumiyoshi, K. et al., "Al0.17Ga0.83N Film Using Middle-Temperature Intermediate Layer Grown on (0001) Sapphire Substrate by Metal-organic Chemical Vapor Deposition," Jpn. J. Appl. Phys. 46(2):491-495, 2007 (http://jjap.ipap.jp/link?JJAP/46/491/).

Shao, Y-P. et al., "Electrical Characterization of Semipolar Gallium Nitride Thin Films," NNIN REU Research Accomplishments, Aug. 2005, pp. 132-133.

* cited by examiner

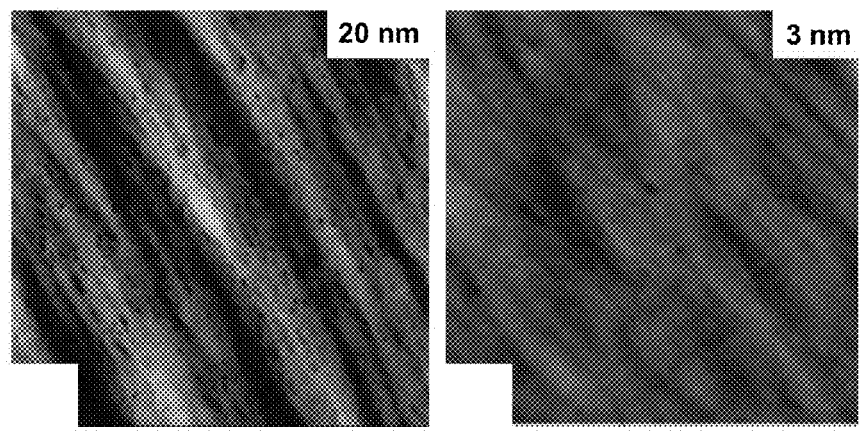
*FIG. 3(a)*          *FIG. 3(b)*

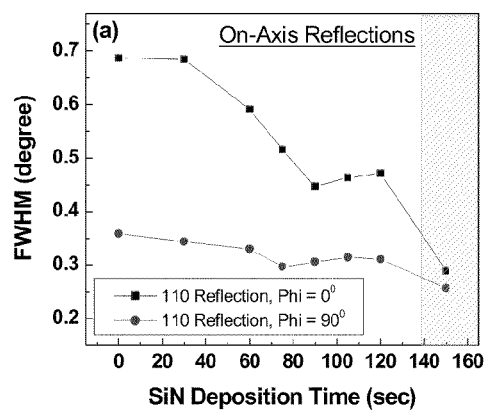
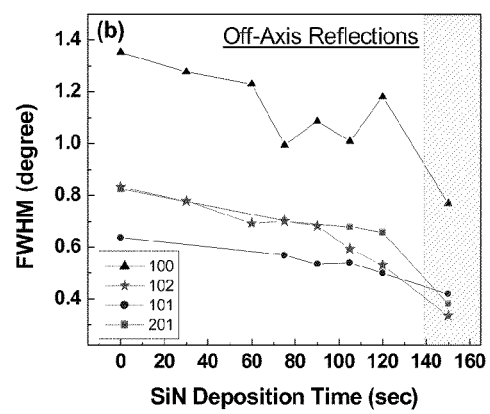
FIG. 4(a)               FIG. 4(b)

IN-SITU DEFECT REDUCTION TECHNIQUES FOR NONPOLAR AND SEMIPOLAR (AL, GA, IN)N

CROSS-REFERENCE TO RELATED APPLICATIONS

This application claims the benefit under 35 U.S.C. Section 119(e) of the following co-pending and commonly-assigned U.S. patent application:

U.S. Provisional Patent Application Ser. No. 60/798,933, filed on May 9, 2006, by Arpan Chakraborty, Kwang-Choong Kim, James S. Speck, Steven P. DenBaars and Umesh K. Mishra, entitled "TECHNIQUE FOR DEFECT REDUCTION IN NONPOLAR AND SEMIPOLAR GALLIUM NITRIDE FILMS USING IN-SITU SILICON NITRIDE NANOMASKING;"

which application is incorporated by reference herein.

This application is related to the following co-pending and commonly-assigned applications:

U.S. Utility application Ser. No. 10/537,644, filed Jun. 6, 2005, by Benjamin A. Haskell, Michael D. Craven, Paul T. Fini, Steven P. Denbaars, James S. Speck, and Shuji Nakamura, entitled "GROWTH OF REDUCED DISLOCATION DENSITY NONPOLAR GALLIUM NITRIDE BY HYDRIDE VAPOR PHASE EPITAXY," now U.S. Pat. No. 7,220,658, issued May 22, 2007, which application claims priority under 35 U.S.C. Section 365(a) of PCT Application No. US03/21918, filed on Jul. 15, 2003, which application claims priority under 35 U.S.C. Section 119(e) of U.S. Provisional Application No. 60/433,843, filed Dec. 16, 2002;

U.S. Utility application Ser. No. 10/537,385, filed Jun. 3, 2005, by Benjamin A. Haskell, Paul T. Fini, Shigemasa Matsuda, Michael D. Craven, Steven P. DenBaars, James S. Speck, and Shuji Nakamura, entitled "GROWTH OF PLANAR, NONPOLAR A-PLANE GALLIUM NITRIDE BY HYDRIDE VAPOR PHASE EPITAXY," now U.S. Pat. No. 7,427,555, issued Sep. 23, 2008, which application claims priority under 35 U.S.C. Section 365(a) of PCT Application No. US03/21916, filed on Jul. 15, 2003, which application claims priority under 35 U.S.C. Section 119(e) of U.S. Provisional Application No. 60/433,844, filed on Dec. 16, 2002;

U.S. Utility application Ser. No. 10/413,691 filed Apr. 15, 2003, by Michael D. Craven, Stacia Keller, Steven P. Denbaars, Tal Margalith, James S. Speck, Shuji Nakamura and Umesh K. Mishra, entitled "NONPOLAR A-PLANE GALLIUM NITRIDE THIN FILMS GROWN BY METALORGANIC CHEMICAL VAPOR DEPOSITION," which application claims the benefit under 35 U.S.C. §19(e) of U.S. Provisional Application No. 60/372,909, filed on Apr. 15, 2002; and U.S. Divisional application Ser. No. 11/472,033, filed Jun. 21, 2006, by Michael D. Craven, Stacia Keller, Steven P. Denbaars, Tal Margalith, James S. Speck, Shuji Nakamura and Umesh K. Mishra, entitled "NONPOLAR (AL,B,IN, GA)N QUANTUM WELL AND HETEROSTRUCTURE MATERIALS AND DEVICES," which application claims the benefit under 35 U.S.C. §120 and §121 of the U.S. patent application Ser. No. 10/413,690, now U.S. Pat. No. 7,091,514, filed on Apr. 15, 2003, by Michael D. Craven et al., entitled "NONPOLAR (Al, B, In, Ga)N QUANTUM WELL AND HETEROSTRUCTURE MATERIALS AND DEVICES," which application claims the benefit under 35 U.S.C. §119(e) of Provisional Patent Application Ser. No. 60/372,909, entitled "NONPOLAR GALLIUM NITRIDE BASED THIN FILMS AND HETEROSTRUCTURE MATERIALS," filed on Apr. 15, 2002, by Michael D. Craven, Stacia Keller, Steven P. Denbaars, Tal Margalith, James S. Speck, Shuji Nakamura, and Umesh K. Mishra;

U.S. Utility patent application Ser. No. 11/486,224, filed on Jul. 13, 2006, by Troy J. Baker, Benjamin A. Haskell, James S. Speck, and Shuji Nakamura, entitled "LATERAL GROWTH METHOD FOR DEFECT REDUCTION OF SEMIPOLAR NITRIDE FILMS", which application claims the benefit under 35 U.S.C. Section 119(e) of U.S. Provisional Patent Application Ser. No. 60/698,749, filed on Jul. 13, 2005, by Troy J. Baker, Benjamin A. Haskell, James S. Speck, and Shuji Nakamura, entitled "LATERAL GROWTH METHOD FOR DEFECT REDUCTION OF SEMIPOLAR NITRIDE FILMS";

U.S. Utility patent application Ser. No. 11/655,573, filed on Jan. 19, 2007, by John F. Kaeding, Dong-Seon Lee, Michael Iza, Troy J. Baker, Hitoshi Sato, Benjamin A. Haskell, James S. Speck, Steven P. DenBaars, and Shuji Nakamura, entitled "METHOD FOR IMPROVED GROWTH OF SEMIPOLAR (Al,In,Ga,B)N," which application claims the benefit under 35 U.S.C. Section 119(e) of U.S. Provisional Patent Application Ser. No. 60/760,739, filed on Jan. 20, 2006, by John F. Kaeding, Dong-Seon Lee, Michael Iza, Troy J. Baker, Hitoshi Sato, Benjamin A. Haskell, James S. Speck, Steven P. DenBaars, and Shuji Nakamura, entitled "METHOD FOR IMPROVED GROWTH OF SEMIPOLAR (Al,In,Ga,B)N";

all of which applications and patent are incorporated by reference herein.

BACKGROUND OF THE INVENTION

1. Field of the Invention

This invention is related to a method for reducing defect density in planar nonpolar and semipolar III-nitride films.

2. Description of the Related Art (Note: This application references a number of different publications as indicated throughout the specification by one or more reference numbers within brackets, e.g., [x]. A list of these different publications ordered according to these reference numbers can be found below in the section entitled "References." Each of these publications is incorporated by reference herein.)

Prior to this invention, the techniques used to achieve defect reduction in nonpolar and semipolar III-nitride films, such as gallium nitride (GaN) films, were lateral epitaxial overgrowth, sidewall lateral epitaxial overgrowth, and selective area lateral epitaxy. All these techniques involve ex situ processing steps and regrowths.

The use of an in-situ silicon nitride ($SiN_x$) interlayer has proved to be an effective technique in defect reduction in conventional c-plane GaN [1-3]. However, in-situ $SiN_x$ has not previously been used for defect reduction in planar nonpolar and semipolar GaN films.

Thus, there remains a need in the art for improved methods of reducing defect density in planar nonpolar and semipolar III-nitride films. The present invention satisfies this need.

SUMMARY OF THE INVENTION

To overcome the limitations in the prior art described above, and to overcome other limitations that will become apparent upon reading and understanding the present specification, the present invention discloses a method for growing reduced defect density nonpolar or semipolar III-nitride layers. The method includes the steps of growing at least one silicon nitride ($SiN_x$) nanomask layer over a III-nitride template (for example, a GaN template), and growing a non polar or semipolar III-nitride layer (for example, a GaN film) on top of the SiN$_x$ nanomask layer, which results in the nonpolar or semipolar III-nitride layer having a reduced defect density as compared to a nonpolar or semipolar III-nitride layer grown without the SiN$_x$ nanomask layer.

BRIEF DESCRIPTION OF THE DRAWINGS

Referring now to the drawings in which like reference numbers represent corresponding parts throughout:

FIGS. 3(a) and 3(b) show 5 μm×5 μm AFM micrographs of a 2 μm thick a-plane GaN template, wherein FIG. 3(a) is a micrograph of the template without SiN$_x$ interlayer, and FIG. 3(b) is a micrograph of the template with 120 seconds of SiN$_x$ interlayer growth, wherein the bars in FIGS. 3(a) and 3(b) represent 20 nm and 3 nm height scales, respectively, to indicate the roughness of the surface.

FIGS. 4(a) and 4(b) show the on-axis (in FIG. 4(a)) and off-axis (in FIG. 4(b)) XRC FWHM of an a-plane GaN template as a function SiN$_x$ deposition time, wherein the shaded region shows the sample which remained uncoalesced after 2 μm of GaN overgrowth.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

The nanomask technique of the present invention comprises several key features relevant to the growth of low-defect density nonpolar and semipolar GaN films. These preferred elements include:

1. Use of a substrate such as, but not limited to, r-plane sapphire, a-plane SiC, m-plane SiC, spinel, lithium-aluminate.

2. Growth of a low or high temperature GaN or AlN or Al$_x$Ga$_{1-x}$N nucleation layer followed by ~0.5 μm (can be thinner or thicker) GaN to achieve coalescence.

3. Growth of a SiN$_x$ layer of optimum thickness over a GaN template in nitrogen ambient and at high growth temperature to achieve high growth rate for SiN.

4. Growth of a thick GaN film above the SiN$_x$ layer.

Note that steps 3 and 4 can be repeated multiple times for further reduction in dislocation density. Also, the GaN coalescence layer right above the SiN$_x$ layer can be grown at an intermediate temperature (approximately 800-1000° C.) to assist further defect reduction by growing the islands larger and the final thick layer is grown at high temperature (approximately 1000-1200° C.) to reduce impurity incorporation.

Technical Description

Implementation of an In-Situ SiN$_x$ Nanomask for Defect Reduction

Based on the previously performed optimization and calibration of the SiN$_x$ growth, interlayers of a SiN$_x$ nanomask are inserted in-situ during the growth of a-plane GaN templates in an attempt to reduce dislocations. This section describes the growth of the reduced-defect a-plane templates and the characterizations performed on them.

Growth of GaN using SiN$_x$ Interlayers

Numerous growth studies were performed to get an understanding of the defect reduction process in a-plane GaN using SiN$_x$ interlayers.

Figure 1:
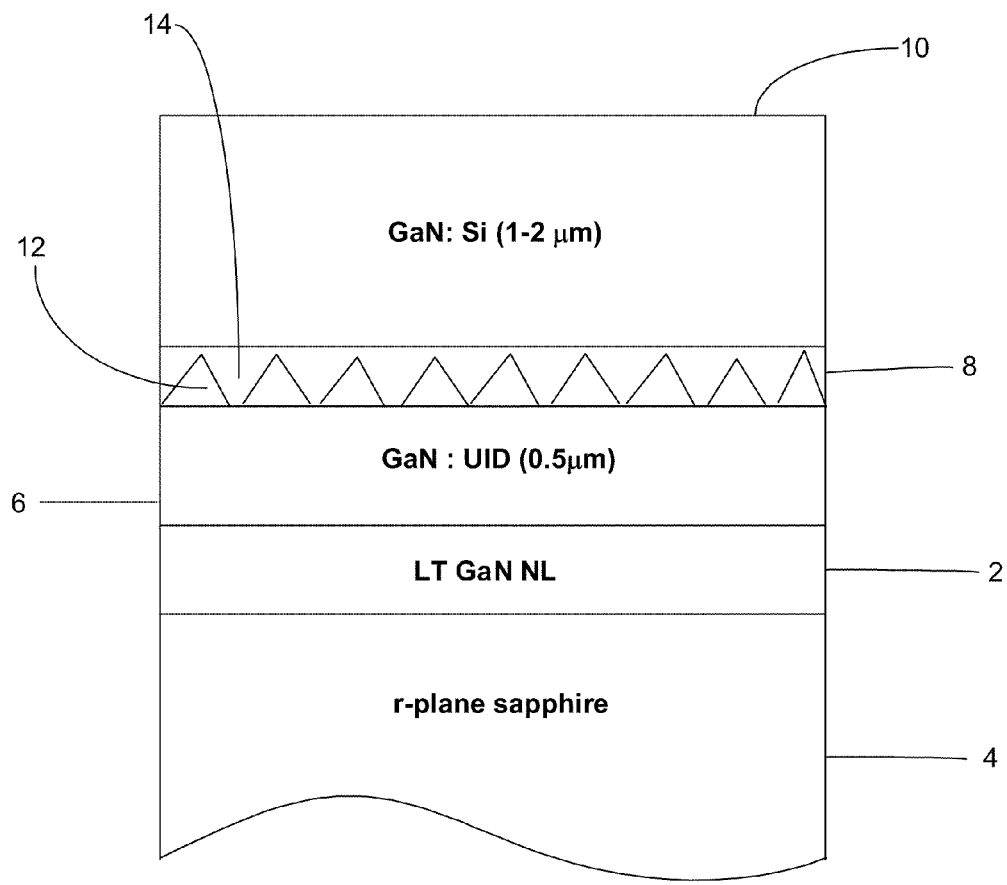
FIG. 1 is a schematic cross-section of a reduced-defect a-plane GaN template with a SiN$_x$ interlayer.

FIG. 1 is a schematic showing a reduced defect a-plane template grown according to one embodiment. The growth of the reduced defect a-plane template was initiated by depositing a low temperature (LT) GaN nucleation layer (2) on an in-situ annealed r-plane sapphire substrate (4). This was followed by the growth of approximately 0.5-0.7 μm thick high temperature (HT) unintentionally doped (UID) GaN (6). Then, a thin layer of SiN$_x$ nanomask (8) was inserted by flowing disilane and ammonia in a nitrogen ambient atmosphere. The thickness of the SiN$_x$ was controlled by varying the growth time of the SiN$_x$ layer from 0 seconds (s) to 150 s. The SiN$_x$ layer was followed by the growth of approximately 0.1 μm thick UID GaN and finally by 2 μm thick Si-doped GaN (10). The final layer was Si-doped in order to measure electrical properties of the overgrown layer.

Trimethylgallium and ammonia were used as sources for the growth of GaN and hydrogen was used as the carrier gas. For the SiN$_x$ growth in this experiment, a diluted disilane tank (40 ppm) was used as there was no additional line to flow disilane for the purpose of Si-doping. The same source was therefore used for SiN$_x$ growth and Si-doping. The morphological evolution of the islands (12) on the SiN$_x$ nano-mask (8) was observed via analysis of "interrupted" growths. A series of samples were grown where the thickness of the HT GaN layer (10) above the SiN$_x$ interlayer was varied from 0 to 2 μm. Since the in-situ characterization capabilities of the particular reactor used are limited to laser reflectance monitoring, this ex-situ approach was employed. The film thickness quoted for the growth of transition samples corresponds to the product of the growth time and the growth rate of the planar two dimensional (2D) GaN film (10).

Following the growth, the samples were characterized by Nomarski microscopy, high-resolution x-ray diffraction (HRXRD), scanning electron microscopy (SEM), atomic force microscopy (AFM), transmission electron microscopy (TEM), and room temperature photoluminescence (PL) measurements.

Nomarski and Atomic Force Microscopy (AFM)

The surface morphology of the as-grown samples was studied by means of Nomarski-mode optical microscopy and AFM. A Digital Instruments D3000 AFM was used in the tapping mode to image the surface of the samples.

Figure 2:
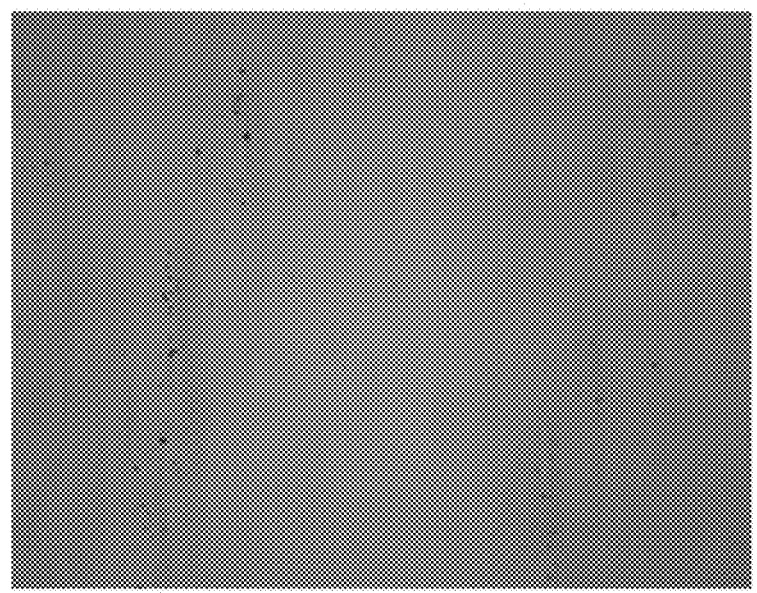
FIG. 2 is a Nomarski image of an a-plane GaN template with 120 seconds of SiN$_x$ growth.

FIG. 2 shows the Nomarski image of the surface of a fully coalesced a-plane GaN film with 120 s of SiN$_x$ interlayer growth, and reveals a smooth and uniform surface with a few occasional pits formed from the coalescence edge.

FIG. 3(a) shows the AFM image of the surface a GaN template comprising a SiN$_x$ nanomask, and FIG. 3(b) shows the AFM image of a GaN template without a SiN$_x$ nanomask. Thus, FIGS. 3(a) and 3(b) illustrate the significant improvement in the surface morphology of a GaN film that occurs after the insertion of a SiN$_x$ interlayer. For example, the improved surface morphology of a GaN film comprises a reduction in the density of sub-micron pits and a decrease in the Root Mean Square (RMS) roughness from 2.6 nm to 0.6 nm.

X-Ray Measurements

The crystalline quality and the crystal mosaic of the as-grown films were determined using a Philips four-circle MRD (Materials Research Diffractometer) x-ray diffractometer operating in receiving slit mode, with four bounce Ge (220)-monochromated Cu Kα radiation and a 1.2 mm slit on the detector arm. Omega x-ray rocking curves (XRCs) were measured for both the GaN on-axis (110) and off-axis (100), (101), (201) and (102) reflections. For on-axis, both c-mosaic (φ=0°) and m-mosaic (φ=90°) XRCs were measured. The modeling of large-mismatch heteroepitaxial thin film/substrate systems has shown that the Full Width at Half Maximums (FWHMS) of the XRCs for these films may be directly related to the film's mosaic structures [4]. According to the analysis presented by Heying et al. for c-GaN films, the on-axis and off-axis FWHMs can be directly correlated to the dislocation density in the crystal [5]. They observed that the on-axis peak widths are broadened by screw and mixed-character dislocations, while off-axis widths are broadened by edge-component Threading Dislocations (TDs) (assuming the TD line direction is parallel to the film normal). Peak broadening due to instrumental resolution and short coherence length was assumed to be negligible.

The on-axis and off-axis XRCs of samples grown with different SiN$_x$ growth times were measured. FIG. 4(a) and FIG. 4(b) plot the FWHM of the measurements as a function of SiN$_x$ growth time. FIG. 4(a) shows the on-axis φ=0° and φ=90° FWHMs for GaN templates without SiN$_x$ interlayer were 0.69° (1290") and 0.36° (2471"), respectively. FIG. 4(b) shows the (101) off-axis peak, which measures the "twist" mosaic, had a FWHM of 0.64° (2292"). These large FWHM values are in agreement with the high dislocation density typically observed in planar a-plane GaN. It can be seen in FIGS. 4(a) and 4(b) that the on-axis and off-axis FWHMs for all the reflections decreased with the increase in the SiN$_x$ deposition time. This decrease signified dislocation reduction in a GaN film with the SiN$_x$ nanomask. It was also noted that for the on-axis scan (FIG. 4(a)), the ratio of m-mosaic to c-mosaic approached unity with the increase in the SiN$_x$ growth time. The minimum XRC FWHMs were obtained for 150 s of SiN$_x$ deposition and the on-axis values were 0.29° (1040") and 0.25° (924") for φ=0° and φ=90°, respectively. The off-axis values were 0.42° (1508"), 0.38° (1375") and 0.33° (1208") for (101), (201) and (102) reflections, respectively. However, the sample grown with 150 s of SiN$_x$ growth could not be coalesced completely after 2 μm thick GaN overgrowth.

Transmission Electron Microscopy (TEM)

TEM has been used to correlate the XRC measurements to the microstructure of a-plane GaN grown with and without a SiN$_x$ interlayer. [1$\bar{1}$00] cross-section and plan-view samples were prepared with a FEI Focused Ion Beam instrument (Model DB235 Dual Beam). Two beam diffraction contrast bright field and dark field images were taken using a FEI Tecnai G2 Sphera Microscope, operated at 200 kV. TEM was performed on samples with a SiN$_x$ growth time of 0 s, 120 s, and 150 s.

Figure 5:
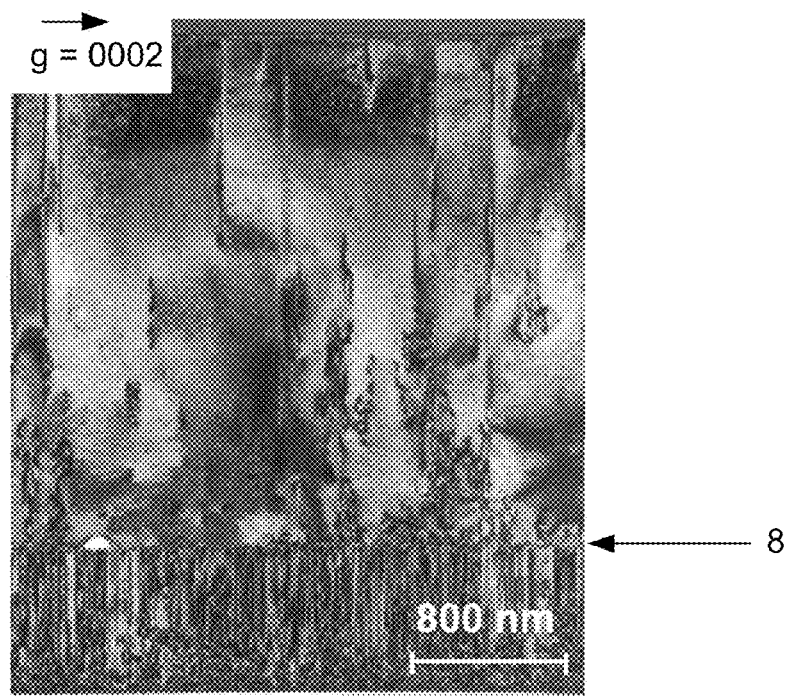
FIG. 5 shows a cross-sectional TEM image of an a-plane GaN template with 150 seconds of SiN$_x$ interlayer growth, wherein the diffraction condition is g=0002.
Figure 6:
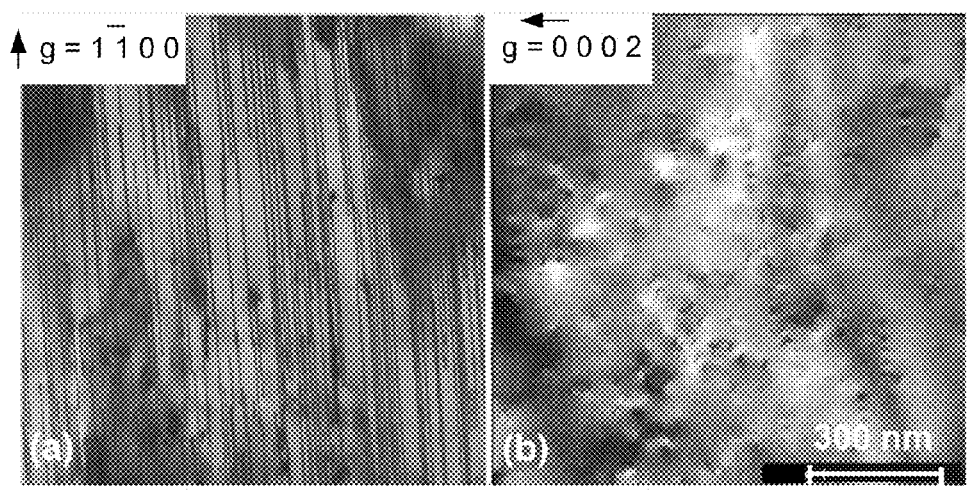
FIGS. 6(a) and 6(b) show plan-view TEM images of an a-plane GaN template with 150 seconds of SiN$_x$ interlayer growth, wherein the diffraction conditions for FIG. 6(a) and FIG. 6(b) are g=1$\bar{1}$00 and 0002, respectively.

FIG. 5 shows the cross-sectional image of a GaN template with 150 s of SiN$_x$ interlayer growth. FIGS. 6(a) and 6(b) show plan view TEM images of an a-plane GaN template with 150 s of SiN$_x$ interlayer growth, wherein the diffraction conditions for FIG. 6(a) and FIG. 6(b) are g=1$\bar{1}$00 and 0002, respectively. From the cross-sectional image, it was observed that the TDs have a common line direction, parallel to the [11$\bar{2}$0] growth direction, for all the samples. Significant annihilation of TDs was observed at the GaN—SiN$_x$—GaN interface and the overgrown region had much lower TD density. Thus, it was evident that dislocation reduction in the GaN template was indeed achieved by the insertion of the SiN$_x$ interlayer.

In addition to the TDs, plan-view TEM on the samples revealed stacking-faults (SFs) aligned perpendicular to the c-axis. The TD and the SF densities for the samples were determined from the plan view images and the values are summarized in Table 1. It is evident from the table that both TD and SF density in the GaN film decreased as a result of the SiN$_x$ nanomasking, which concurs with the HRXRD findings.

TABLE 1

Summary of the TEM results

| | SiN$_x$ Deposition Time (seconds) | | |
|---|---|---|---|
| | 0 | 120 | 150 |
| TD Density (cm$^{-2}$) | 6 × 10$^{10}$-8 × 10$^{10}$ | 1 × 10$^{10}$-3 × 10$^{10}$ | 9 × 10$^9$ |
| SF Density (cm$^{-1}$) | 6 × 10$^5$-8 × 10$^5$ | 4 × 10$^5$ | 3 × 10$^5$ |

Photoluminescence (PL) Measurement

Figure 7:
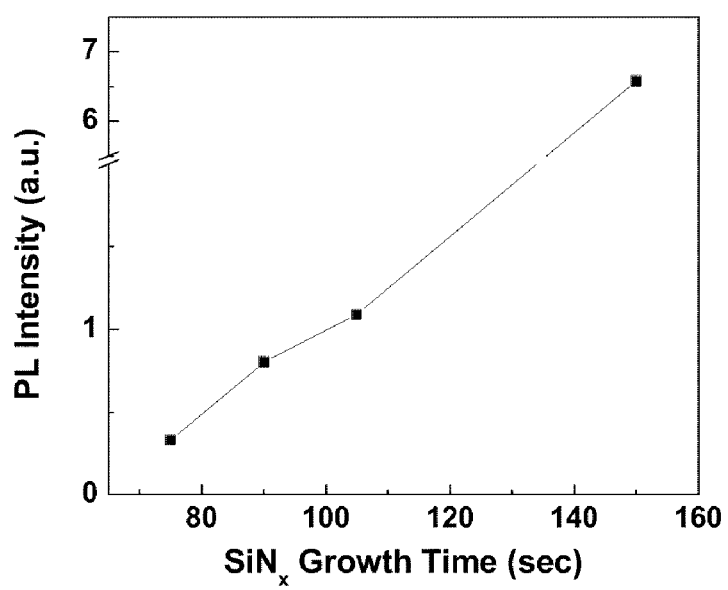
FIG. 7 plots photoluminescence (PL) intensity as a function of SiN$_x$ growth time, showing improvement of the GaN band-edge PL emission with the increase in SiN$_x$ growth time.

FIG. 7 shows how the PL intensity of the GaN band-edge improved with the SiN$_x$ nanomasking. The a-GaN sample without the SiN$_x$ interlayer did not show band-edge emission. However, as shown in FIG. 7, with the increase in the SiN$_x$ thickness, PL emission intensity increased. The increased emission intensity is probably a consequence of reduction in the TD density. The much increased emission intensity from the sample with 150 s of SiN$_x$ is probably due to the increased light extraction from the uncoalesced facets of the sample.

Process Steps

Figure 8:
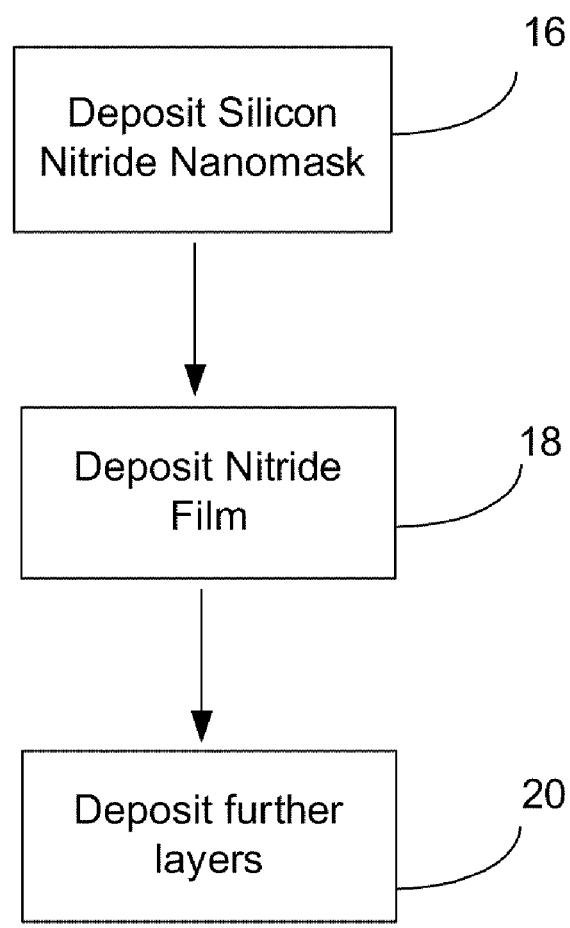
FIG. 8 is a flow chart representing a nanomasking method for growing reduced defect density planar nitride films.

FIG. 8 is a flow chart illustrating a method for growing a reduced defect density semipolar and nonpolar III-nitride layer.

Block 16 represents the step of growing at least one SiN$_x$ nanomask layer over a III-nitride (e.g., GaN) template, wherein the nanomask is a mask with openings on a nanometer scale.

The GaN template may include a growth on a substrate of a low or high temperature nitride nucleation layer, followed by an approximately 0.5 μm thickness of GaN to achieve coalescence. Alternatively, the GaN template may be a free-standing GaN wafer. The GaN template has a crystallographic orientation, such as nonpolar (a-plane or m-plane, for example) or semipolar ((10-1-1), (10-1-3), (10-2-2), for example).

The growth of the SiN$_x$ nanomask layer may be in a nitrogen ambient and at a high growth temperature to achieve a high growth rate for the SiN$_x$ nanomask. Growth temperature was changed from 700-1200° C., and it was found that the growth rate increases linearly. In one embodiment, approximately 1150° C. was used for the SiN$_x$ growth.

The nanomask layer may have a thickness achieved by flowing disilane and ammonia in nitrogen ambient for a period of time in the range 0-150 s (although this can be larger as well, depending on the growth rate). The nanomask may comprise a growth of SiN$_x$ islands. The nanomask may comprise at least one open pore.

Block 18 shows the step of growing a thickness of at least one nonpolar or semipolar III-nitride (e.g., GaN) layer, on top of the SiN$_x$ nanomask layer. The nonpolar or semipolar III-nitride film may comprise a structure such as a doped GaN layer deposited on a UID GaN layer. The growth of the nonpolar or semipolar III-nitride layer on top of the SiN$_x$ nanomask layer may comprise a nano lateral epitaxial overgrowth on at least one open pore in the SiN$_x$ nanomask, with the nonpolar or semipolar III-nitride layer growing through the open pore and laterally over the SiN$_x$ nanomask layer, in order to form a coalesced or uncoalesced film. In one embodiment, the open pore is a nanoscale open pore.

The nanomasking may lead to an improved surface morphology for the film, for example, a surface roughness of at most 0.6 nm in a 5 μm×5 μm area.

In addition, the nanomasking method leads to a reduced dislocation density (such as TD or stacking fault) for the film. For example, the GaN on top of the SiN$_x$ nanomask layer may have a threading dislocation density less than $9 \times 10^9$ cm$^2$ and a stacking fault density less than $3 \times 10^5$ cm$^{-1}$. The reduced dislocation density may be evidenced by a reduced X-Ray rocking curve FWHM. For example, the GaN on top of the SiN$_x$ nanomask layer may be characterized by on-axis XRC FWHMs less than 0.29° (1040") and 0.25° (924") for $\phi=0°$ and $\phi=90°$, respectively, and off-axis XRC FWHMs less than 0.42° (1508"), 0.38° (1375") and 0.33°(1208") for (101), (201) and (102) reflections, respectively. The nanomasking may lead to an increased photoluminescence emission for the film. The film also exhibits an increased electron mobility in a n-type doped layer (e.g., ~167 cm$^2$/V-s for a sample with an SiN interlayer as compared to ~30 cm$^2$/V-s for a sample without this interlayer).

Block 20 represents the optional step of growing further layers, for example, with reduced defect density, on top of the nonpolar or semipolar III-nitride layer. The further layers may comprise another SiN$_x$ nanomask or nitride layer for the formation of a GaN based device. These layers may be deposited in-situ or ex-situ.

The SiN$_x$ growth may be in-situ with the GaN film growth. Additional steps may be added as desired. An optimum SiN$_x$ nanomask thickness is one and a half monolayer, and coalesced films may not form for the SiN$_x$ having a thickness greater than 1.5 nm. An optimum thickness of the GaN film is greater than 1 μm, because thinner films may not coalesce.

In addition, a device (such as an electronic or optoelectronic device, e.g., a light emitting diode, laser diode or transistor) or a template may be fabricated using this method. The device may comprise a nitride device, a device fabricated from non polar or semipolar growth, or a device grown on a template fabricated by this method.

Note that, in an alternative embodiment, deposition of the SiN layers may not be the first step; instead, it can be preceded by the growth of an (Al, In, Ga)N layer. In addition, the growth conditions for the layer below and the layers above the SiN layers might be different.

For example, alternative embodiments may comprise the following:
1. Substrate (either sapphire or SiC or LiAlO$_3$ or free-standing GaN substrate, etc.).
2. Nucleation layer (optional depending on the substrate).
3. (Al, Ga, In)N layer (optional, can be thick or thin).
4. SiN$_x$ interlayer.
5. (Al, Ga, In)N layer (optional, can be thick or thin, at intermediate or high temperature).
4. SiN$_x$ interlayer.
5. (Al, Ga, In)N layer (optional, can be thick or thin, at intermediate or high temperature).
6. Steps 4 and 5 above can be repeated multiple times.
7. (Al, Ga, In)N layer (preferably a thick layer at high temperature).

Possible Modification and Variations

The preferred embodiment has described a process by which low defect density GaN films may be grown along a crystallographic orientation comprising nonpolar and semipolar directions, using the technique of SiN$_x$ nanomasking for defect-reduction. The specific example described in the Technical Description section was for an a-plane GaN film (i.e., the growth direction or crystallographic orientation was the GaN <11$\bar{2}$0> direction). However, our research has established that growth procedures for a-plane nitrides are typically compatible with or easily adaptable to crystallographic orientations comprising m-plane and semipolar nitride growth. Therefore, this process is applicable to films and structures grown along either the würtzite <11$\bar{2}$0> or <1$\bar{1}$00> or other semipolar directions.

The base layer for the GaN film described above was an MOCVD-grown a-plane GaN template grown on r-plane Al$_2$O$_3$. Alternative substrates can be used in the practice of this invention without substantially altering its essence. For example, the base layer for either process could consist of an a-plane GaN film grown by MBE, MOCVD, or HVPE on an a-plane SiC substrate. Other possible substrate choices include, but are not limited to, a-plane 6H-SiC, m-plane 6H-SiC, a-plane 4H-SiC, m-plane 4H-SiC, other SiC polytypes and orientations that yield nonpolar GaN, a-plane ZnO, m-plane ZnO, (100) LiAlO$_2$, (100) MgAl$_2$O$_4$, free-standing a-plane GaN, free-standing AlGaN, free-standing AlN or miscut variants of any of these substrates. These substrates do not necessarily require a GaN template layer be grown on them prior to SiN nanomasking.

The thicknesses of the GaN layers in the structure described above may be substantially varied without fundamentally deviating from the preferred embodiment of the invention. Doping profiles may be altered as well. Additional layers may be inserted in the structure or layers may be removed. The number of SiN$_x$ layers can be increased. The precise growth conditions described in the Technical Description may be expanded as well. Acceptable growth conditions vary from reactor to reactor depending on the geometry of configuration of the reactor. The use of alternative reactor designs is compatible with this invention with the understanding that different temperature, pressure ranges, precursor/reactant selection, V/III ratio, carrier gases, and flow conditions may be used in the practice of this invention.

This invention would lead to improvement in carrier transport as mobility increases with the reduction in defect, wherein electron mobility of ~167 cm2/V-s has been achieved with 120 s of SiN deposition, which can be improved or optimized further.

This invention will offer significant benefits in the design and fabrication of a range of devices, including but not limited to nonpolar and semipolar nitride-based optoelectronic devices having wavelengths between 360 and 600 nm and nonpolar and semipolar nitride-based laser diodes operating in a similar wavelength range. Electronic devices will also benefit from this invention. The advantage of higher mobility in nonpolar p-GaN can be employed in the fabrication of bipolar electronic devices such as heterostructure bi-polar transistors, etc.

More generally, this method can be performed using any III-nitride instead of GaN, or by growing the III-nitride on the GaN. The template may be a III-nitride template.

Finally, another in-situ technique can be used in combination with the $SiN_x$ interlayer technique. The technique involves nucleating at an intermediate growth temperature, not too low and not too high, which has been tried in c-plane GaN [7].

Advantages and Improvements Over Existing Practice

Defect reduction in substrates helps in improving the performance of devices grown on them. Thus this technique of defect-reduction will improve the performances of nonpolar and semipolar Gr-III nitrides based devices grown on reduced-defect templates.

Compared to the more widely used lateral epitaxial overgrowth (LEO) technique, the use of an in-situ prepared amorphous and nanoporous $SiN_x$ layer has the advantage of maskless, one-step processing, and possible contamination associated with the ex situ lithography process in traditional Epitaxial Lateral Overgrowth (ELO) methods can be eliminated. The reduced feature sizes of the $SiN_x$ network also facilitates nanometer-scale lateral epitaxial overgrowth (nano-LEO) at the open pores, labeled 14 in FIG. 1, thereby considerably reducing the inhomogeneity between the wing and window regions commonly seen in the traditional LEO growth which has adverse effect on devices.

Also, the SiN interlayer helps in strain relaxation due to heteroepitaxy. This allows us to grow thicker epilayer, which would be otherwise not possible due to strain-induced cracking.

REFERENCES

The following publications are incorporated by reference herein:

1. S. Sakai, T. Wang, Y. Morishima and Y. Naoi, J. Cryst. Growth, 221, 334 (2000).
2. S. Tanaka, M. Takeuchi and Y. Aoyagi, Jap. J. Appl. Phys., 38, L831 (2000).
3. F. Yun, Y.-T. Moon, Y. Fu, K. Zhu, U. Ozgur, H. Morkoc, C. K. Inoki, T. S Kuan, A. Sagar, and R. M. Feenstra, J. Appl. Phys., 98, 123502 (2005).
4. V. Srikant, J. S. Speck and D. R. Clarke, J. Appl. Phys. 82, 4286 (1997).
5. B. Heying, X. H. Wu, S. Keller, Y. Li, D. Kapolnek, B. P. Keller, S. P. Denbaars and J. S. Speck, Appl. Phys. Lett., 68, 643 (1996).
6. A. Chakraborty, K. C. Kim, F. Wu, J. S. Speck, S. P. DenBaars, and U. K. Mishra, Appl. Phys. Lett., 89, 041903 (2006).
7. K. Sumiyoshi, M. Tsukihara, K. Kataoka, S. Kawamichi, T. Okimoto, K. Nishino, Y. Naoi, and S. Sakai, "$Al_{0.17}Ga_{0.83}N$ Film Using Middle-Temperature Intermediate Layer Grown on (0001) Sapphire Substrate by Metal-Organic Chemical Vapor Deposition," Jap. J. Appl. Phys., Vol. 46, No. 2, 2007, pp. 491-495 (http://jjap.ipap.jp/link?J-JAP/46/491/).

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method for growing a reduced defect density nonpolar or semipolar III-nitride layer, comprising:
    (a) growing at least one nonpolar or semipolar III-nitride layer on top of at least one $SiN_x$ nanomask layer, which results in the nonpolar or semipolar III-nitride layer having a planar top surface that is a nonpolar or semipolar plane and a reduced defect density as compared to a nonpolar or semipolar III-nitride layer grown without the $SiN_x$ nanomask layer.

2. The method of claim 1, wherein the nonpolar or semipolar III-nitride layer is a planar, coalesced film.

3. The method of claim 1, wherein the nonpolar or semipolar III-nitride layer is GaN.

4. The method of claim 1, wherein the growth of the nonpolar or semipolar III-nitride layer on top of the $SiN_x$ nanomask layer is a nano lateral epitaxial overgrowth on at least one open pore in the $SiN_x$ nanomask layer, with the nonpolar or semipolar III-nitride layer growing through the open pore and laterally over the $SiN_x$ nanomask layer.

5. The method of claim 4, wherein the open pore is a nanoscale open pore.

6. The method of claim 1, further comprising growing the $SiN_x$ nanomask layer over a III-nitride template prior to growing the nonpolar or semipolar III-nitride layer.

7. The method of claim 6, wherein the growth of the $SiN_x$ nanomask layer is in-situ with the growth of the nonpolar or semipolar III-nitride layer.

8. The method of claim 6, wherein the III-nitride template comprises a growth on a substrate of a nitride nucleation layer followed by approximately 0.5 µm thick III-nitride layer to achieve coalescence below the $SiN_x$ layer.

9. The method of claim 6, wherein the III-nitride template is a nonpolar or semipolar template.

10. The method of claim 6, wherein the III-nitride template is a free-standing wafer.

11. The method of claim 6, wherein the growth of the $SiN_x$ nanomask layer is in a nitrogen ambient and at a high growth temperature of approximately 1000-1200° C. to achieve a high growth rate for the $SiN_x$ nanomask layer.

12. The method of claim 6, wherein the $SiN_x$ nanomask layer is grown to a specified thickness achieved by flowing disilane and ammonia in nitrogen ambient for a specified period of time.

13. The method of claim 6, wherein the growth of the $SiN_x$ nanomask layer is in a nitrogen ambient and at a high pressure of approximately 500-760 Torr to achieve a high growth rate for the $SiN_x$ nanomask layer.

14. The method of claim 6, wherein the growth of the $SiN_x$ nanomask layer is in a nitrogen ambient and at a low ammonia partial pressure of approximately 1 slpm of ammonia in a total mixture of approximately 10 slpm to achieve a high growth rate for the $SiN_x$ nanomask layer.

15. The method of claim 1, wherein a thicker $SiN_x$ nanomask layer leads to lower defect density for the nonpolar or semipolar III-nitride layer.

16. The method of claim 1, wherein an optimum $SiN_x$ nanomask layer thickness is approximately 0.4-1 nm.

17. The method of claim 1, wherein the nonpolar or semipolar III-nitride layer does not form a coalesced film for the $SiN_x$ nanomask layer having a thickness greater than 1.5 nm.

18. The method of claim 1, wherein the $SiN_x$ nanomask layer is comprised of a growth of $SiN_x$ islands.

19. The method of claim 1, wherein the nonpolar or semipolar III-nitride layer is grown on the $SiN_x$ nanomask layer at an intermediate growth temperature of approximately 800-1000° C. to help in further reduction of defect density by increasing three-dimensional island size in the nonpolar or semipolar III-nitride layer.

20. A device fabricated using the method of claim 1.

21. A device, comprising:
(a) at least one $SiN_x$ nanomask grown on a III-nitride template; and
(b) nonpolar or semipolar III-nitride grown on top of the $SiN_x$ nanomask and having a planar top surface that is a nonpolar or semipolar plane and having a reduced defect density as compared to nonpolar or semipolar III-nitride grown without the $SiN_x$ nanomask.

22. The device of claim 21, wherein the nonpolar or semipolar III-nitride is GaN.

23. The device of claim 21, wherein the nonpolar or semipolar III-nitride has a threading dislocation density less than $9 \times 10^9$ $cm^{-2}$ and a stacking fault density less than $3 \times 10^5$ $cm^{-1}$.

24. The device of claim 21, wherein the nonpolar or semipolar III-nitride is characterized by
on-axis X-Ray Rocking Curve (XRC) Full Width at Half Maximums (FWHM) less than 0.29° (1040") and 0.25° (924") for $\phi=0°$ and $\phi=90°$, respectively; and
off-axis XRC FWHMs less than 0.42° (1508"), 0.38° (1375") and 0.33° (1208") for (101), (201) and (102) reflections, respectively.

25. The device of claim 21, wherein the nonpolar or semipolar III-nitride has a surface roughness of at most 0.6 nm in a 5 μm×5 μm area.

26. The device of claim 21, wherein the nonpolar or semipolar III-nitride is a film having an optimum thickness of approximately 1 μm or thicker.

27. The device of claim 21, wherein the nonpolar or semipolar III-nitride is a film having an electron mobility of at least 167 $cm^2$/Vs.

* * * * *